United States Patent
Koch et al.

(10) Patent No.: US 9,596,759 B2
(45) Date of Patent: Mar. 14, 2017

(54) ELECTRICAL COMPONENT CARRIER WITH VARIABLE THICKNESS CONDUCTOR TRACKS

(71) Applicant: Kiekert Aktiengesellschaft, Heiligenhaus (DE)

(72) Inventors: Asmus Koch, Cologne (DE); Inga Heinzen, Krefeld (DE); Jan Fassel, CZ-Nejdek (CZ); Jan Suk, CZ-Cechtice (CZ)

(73) Assignee: Kiekert Aktiengesellschaft, Heiligenhaus (DE)

( * ) Notice: Subject to any disclaimer, the term of this patent is extended or adjusted under 35 U.S.C. 154(b) by 0 days.

(21) Appl. No.: 14/655,788

(22) PCT Filed: Dec. 23, 2013

(86) PCT No.: PCT/DE2013/000822
§ 371 (c)(1),
(2) Date: Jun. 26, 2015

(87) PCT Pub. No.: WO2014/106502
PCT Pub. Date: Jul. 10, 2014

(65) Prior Publication Data
US 2015/0382462 A1    Dec. 31, 2015

(30) Foreign Application Priority Data
Dec. 27, 2012    (DE) .................... 20 2012 105 073 U

(51) Int. Cl.
*E05B 81/54*    (2014.01)
*E05B 85/02*    (2014.01)
(Continued)

(52) U.S. Cl.
CPC ............... *H05K 1/11* (2013.01); *E05B 81/54* (2013.01); *E05B 85/02* (2013.01); *F03D 7/0224* (2013.01);
(Continued)

(58) Field of Classification Search
CPC ........... E05B 85/02; E05B 81/54; H05K 1/09; H05K 3/202; H05K 3/244; H05K 2201/10424
(Continued)

(56) References Cited

U.S. PATENT DOCUMENTS 5,179,601 A * 1/1993 Gotoh ................ B29C 45/1671
                                                        385/14
6,190,209 B1 * 2/2001 Hulsmann ............... E05B 85/02
                                                        439/660
(Continued)

FOREIGN PATENT DOCUMENTS

DE    4323827 C1    12/1994
DE    10139356 A1    2/2003
(Continued)

OTHER PUBLICATIONS

ASTM E 140-02 Standard Hardness Conversion Tables for Metals Relationship Among Brinell Hardness, Vickers Hardness, Rockwell Hardness, Superficial Hardness, Knoop Hardness, and Scleroscope Hardness.*
(Continued)

*Primary Examiner* — Timothy Thompson
*Assistant Examiner* — Michael F McAllister
(74) *Attorney, Agent, or Firm* — Woodard, Emhardt, Moriarty, McNett & Henry LLP

(57) ABSTRACT

Component carrier for electrical/electronic components, for example for the combination with a lock housing or as a component of a lock housing of a motor vehicle door lock,
(Continued)

comprising a carrier element and a conductor track structure of individual metallic conductor tracks, which can be connected to the carrier element, wherein the conductor track structure is composed of at least two conductor track partial structures, each having a different material thickness, of the associated conductor tracks.

20 Claims, 2 Drawing Sheets

(51) Int. Cl.
    *H05K 1/09*     (2006.01)
    *H05K 1/11*     (2006.01)
    *F03D 7/02*     (2006.01)
    *H05K 7/02*     (2006.01)

(52) U.S. Cl.
    CPC ............. *F03D 7/0228* (2013.01); *H05K 1/09* (2013.01); *H05K 7/026* (2013.01); *F05B 2260/79* (2013.01); *Y02E 10/723* (2013.01)

(58) Field of Classification Search
    USPC .......................................... 174/257
    See application file for complete search history.

(56) References Cited

U.S. PATENT DOCUMENTS

| | | | | |
|---|---|---|---|---|
| 6,399,882 B1* | 6/2002 | Faulkner | ............... | E05D 7/1066 174/101 |
| 6,521,830 B1* | 2/2003 | Platz | ....................... | B29C 70/72 174/50 |
| 2004/0245786 A1* | 12/2004 | Hashiba | ................. | E05B 81/14 292/216 |
| 2010/0263920 A1* | 10/2010 | Westmarland | ......... | H05K 3/202 174/257 |

FOREIGN PATENT DOCUMENTS

| | | | |
|---|---|---|---|
| DE | 102005049975 C5 | | 4/2007 |
| DE | 102006017830 A1 | | 10/2007 |
| DE | 102005049975 | * | 11/2008 |
| DE | 102009002902 A1 | | 11/2010 |
| DE | 202010009708 U1 | | 11/2011 |
| WO | WO 2009010734 A1 | | 1/2009 |

OTHER PUBLICATIONS

Machine translation of DE10139356A1 by Lexis Nexis Total Patent on Jul. 16, 2015.
Machine translation of DE102005049975C5 by Lexis Nexis Total Patent on Jul. 16, 2015.
Machine translation of DE102006017830A1 by Lexis Nexis Total Patent on Jul. 16, 2015.
Machine translation of DE102009002902A1 by Lexis Nexis Total Patent on Jul. 16, 2015.
Machine translation of DE202010009708U1 by Lexis Nexis Total Patent on Jul. 16, 2015.
Machine Translation of DE4323827C1 by Google Patent on Jul. 16, 2015.

* cited by examiner

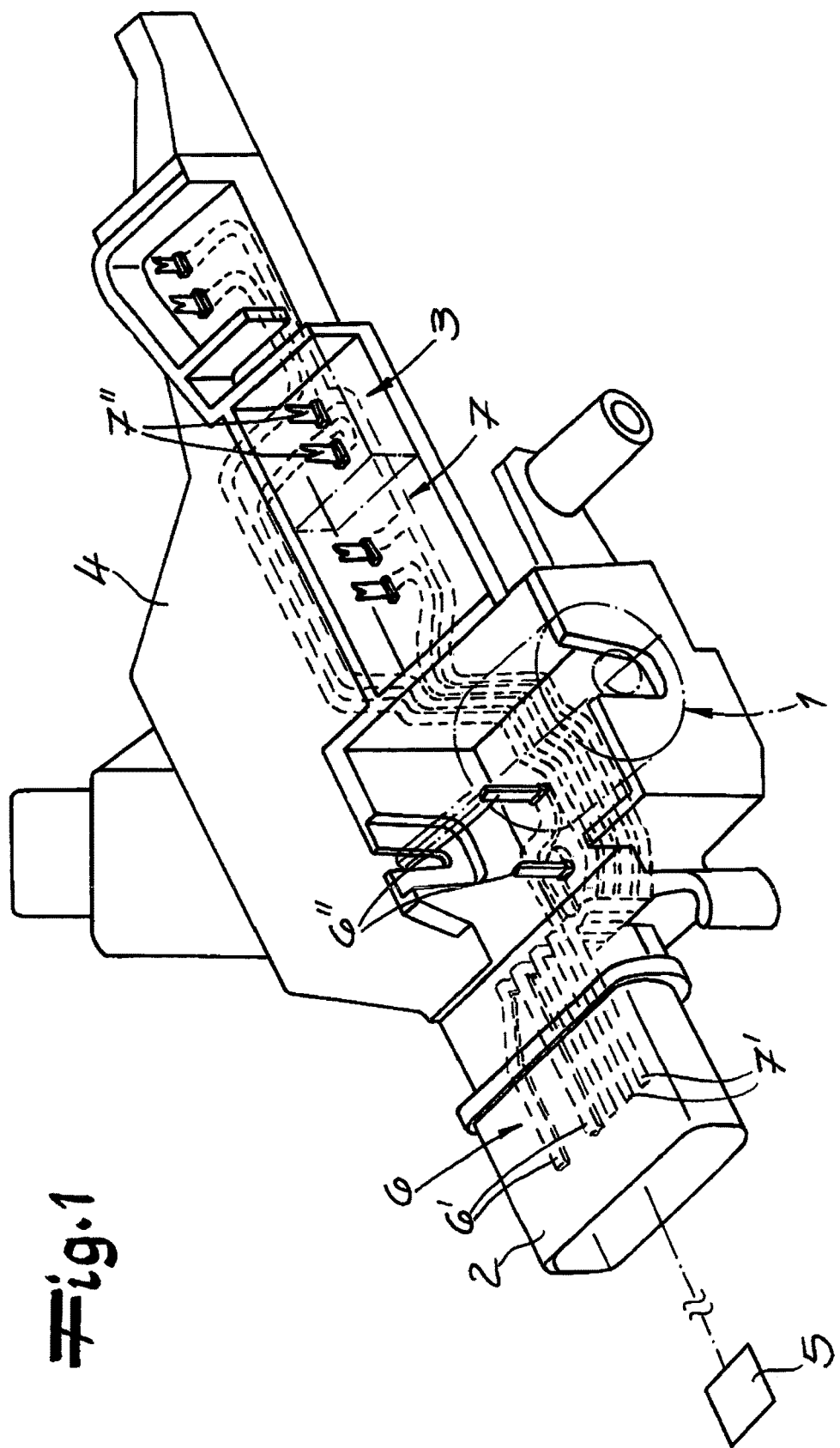

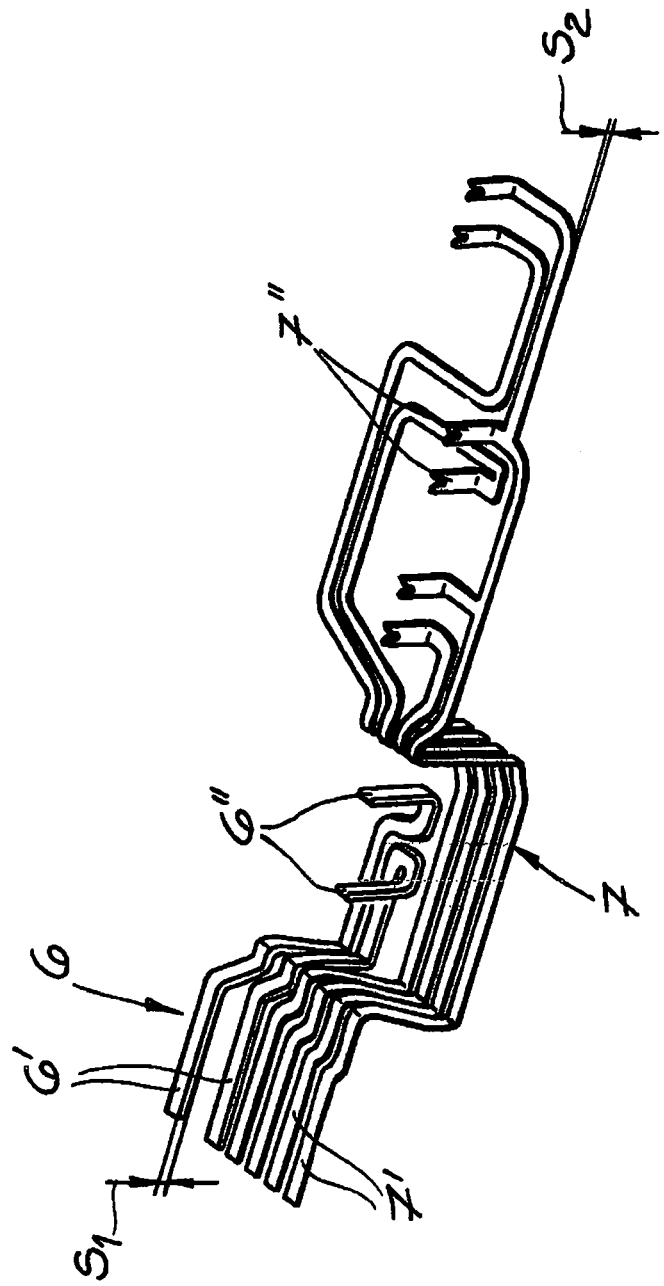

ELECTRICAL COMPONENT CARRIER WITH VARIABLE THICKNESS CONDUCTOR TRACKS

CROSS-REFERENCE TO RELATED APPLICATIONS

This application is the U.S. national stage application of International Patent Application No. PCT/DE2013/000822, filed Dec. 23, 2013, which claims priority of German Application No. 10 2012 105 073.0, filed Dec. 27, 2012, which are both hereby incorporated by reference.

BACKGROUND

The invention relates to a component carrier for electrical/electronic components, for example for the combination with a latch housing or as a component of a latch housing of a motor vehicle door latch, comprising a carrier element and a strip conductor structure consisting of individual metallic strip conductors, which can be connected to the carrier element.

The component carrier with the aforementioned design, as disclosed in DE 10 2005 049 975 C5 is a latch housing of a motor vehicle door latch, containing at least one base element. The strip conductor structure is made from tinplate, consisting of cold-rolled sheet steel with a thickness of up to 0.5 mm. Also, a white shimmering tin coating of 5 μm is electrolytically applied. In this manner, a cost effective and sturdy design of a component carrier is provided.

Similar component carriers are disclosed in DE 101 39 356 A1 or also in DE 20 2010 009 708 U1.

As usual, the component carrier serves to accommodate electrical and/or electronic components on its carrier element and to connect the components to each other or to a remote control unit with the aid of a strip conductor structure. Once the electrical or electronic components have been fitted, the entire component carrier is usually encased in a casting compound in order to protect it against environmental influences. The strip conductor structure is generally a leadframe combining the different strip conductors and allowing their joint production. Together with the carrier element or the electrical/electronic components, the strip conductor structure is, once completed, mostly or entirely encased in casting compound. This procedure has generally proven to be successful.

For reasons of cost, prior art embodiments or practical applications generally have the aim of keeping the material thickness of the used strip conductor structure as thin as possible. The generic teaching disclosed in DE 10 2005 049 975 C5 uses at this point tinplate with a thickness of only up to 0.5 mm. The trend of saving material and using thinner and thinner material thicknesses results, however, in increasing installation problems. Especially when connecting motors or other larger and weighty components and electrical and electronic components to the strip conductor structure the problem occurs that angled lugs of the strip conductor structure can be inadvertently bent. This can even occur during operation as a result of the unavoidable movements of the motor. Consequently, contact problems can occur in practical application, which become particularly problematic after a certain operating time and are difficult to remedy. The invention aims to provide a solution for this.

SUMMARY

The invention is based on the technical problem of, further developing said component carrier in such a way that current and future contact problems basically no longer occur and that permanent correct functioning is guaranteed.

In order to solve this technical problem, the invention suggests for a generic component carrier housing electrical/electronic components that the strip conductor structure is composed of at least two strip conductor partial structures each having a different material thickness of the associated strip conductors.

According to the invention, the strip conductor structure consists of at least two parts or is divided into two parts. In most cases at least two strip conductor partial structure are provided, each with a different material thickness of the associated strip conductors. The two strip conductor partial structures advantageously consist of a switch strip conductor structure with a predetermined material thickness as well as a motor strip conductor structure with a greater material thickness than the switch strip conductor structure.

This means that the respective strip conductors of the motor strip conductor structure have a greater material thickness then the strip conductors of the switch strip conductor structure. Overall, the design is such that the respective strip conductors of the switch strip conductor structure and of the motor strip conductor structure have a constant uniform material thickness. In principle, also different material thicknesses can be used inside the respective strip conductor partial structure. According to the invention the design is, however, such that the respective strip conductors of the switch strip conductor structure have a thinner material thickness than the respective strip conductors of the motor strip conductor structure.

This design meets the different mechanical stresses during installation and operation. The switch strip conductor structure is generally used to connect switches, sensors, relays or other low-weight and small-sized electrical/electronic components, which also do not move during operation. It consequently suffices for the strip conductors of the switch strip conductor structure to have a thin material thickness of generally less than 0.5 mm or in most cases even 0.4 mm or even less.

In contrast, the motor strip conductor structure is provided for connecting electrical or electronic components with a respectively heavier weight and, in particular, such components that move during operation, such as, in particular, electric motors. At this point it is important that respective lugs or the motor strip conductor structure have a sturdy design as such and that the lugs do not tend to bend, break, etc. The respective strip conductors of the motor conductor truck structure do consequently typically have double the material thickness compared to the strip conductor of the switch strip conductor structure. The material thickness is mostly approx. 0.8 mm and more.

In this way, the inventive strip conductor structure with the two strip conductor partial structures or the switch strip conductor structure and the motor strip conductor structure is individually adapted to the electric/electronic components to be connected. Consequently, low weight electrical/electronic devices without movement are typically connected by means of the switch strip conductor structure, which is advantageous for this purpose as thin material thicknesses in the area of approx. 0.4 mm to 0.5 mm are and can be used. This results in significant material savings compared to a strip conductor structure consisting, for instance, of strip conductors with a respective material thickness of approx. 0.8 mm.

In contrast, the separate motor strip conductor structure has strip conductors with greater material thicknesses, typically above 0.7 mm and, in particular 0.8 mm and more. As a result, the motor strip conductor structure has a significant rigidity and, in particular lugs do not tend to bend or break when connecting, for instance, electric motors. The lugs do also not bend or break during operation so that the connection of the electric motors typically connected to the motor strip conductor structure exists and is set up permanently and correctly over the entire service life.

The switch strip conductor structure extends over an area that is typically a multiple of the area of the motor strip conductor structure. This is due to the fact that the component carrier of the invention combined with or as part of the latch housing of a motor vehicle door latch, accommodates a plurality of switches, sensors, etc., whilst generally only one or two motors have to be connected by means of the motor strip conductor structure. The greater material thickness of the motor strip conductor structure compared to that of the switch strip conductor structure is practically negligible and the strip conductor structure of the invention can be produced at a similar cost than previous strip conductor structures whilst offering an improved and more permanent functionality.

This is aided by the circumstance that the two strip conductor structures are typically produced from different materials. For the production of the switch strip conductor structure the invention recommends a regularly cold-formed material, such as for instance brass. In this way, the contacts for and connection of the switches, sensors, etc. can be easily achieved with the switch strip conductor structure. In contrast, the motor strip conductor structure is typically made from a heat-formable metal, such as tinplate. As a result, the motor strip conductor structure as such offers a considerable and adequate rigidity in order to connect, in particular, electric motors without bending, breaking, etc. of the respective lugs. The used tinplate is typically a cold-rolled sheet steel containing a tin coating of at least 5 µm. The tin layer can be applied electrolytically as described in detail in the generic prior art disclosed in DE 10 2005 049 975 C5.

As a result, the strip conductor structure of the invention has the overall required corrosion-protected design, which the brass switch strip conductor structure has anyway and which is provided by the tin coating for the motor strip conductor structure. A further advantage is that as a result of the tin coating, the motor strip conductor structure can be easily electrically soldered using acid-free flux, so that said electric motors can be easily and permanently electrically connected to the motor strip conductor structure. For the brass switch strip conductor structure this applies anyway without any additional processing steps, coating, etc.

Generally, both strip conductor structures are produced by stamping. The two strip conductor structures can be produced separately or jointly. In the latter case, the two strip conductor structures are a combined complete strip conductor structure, which is subsequently combined with the component carrier. Where the two strip conductor partial structures are produced separately, it is recommended to combine each strip conductor partial structure separately with the component carrier.

Given the different materials described and used for the switch strip conductor structure and the motor strip conductor structure, different thicknesses are also provided. The switch strip conductor structure generally made from brass has a Brinell hardness of approx. 35 to 200 HB. In contrast, the motor strip conductor structure, made for instance of tinplate, has a Rockwell hardness of between 48 HR and 56 HR. This different design also shows that the motor strip conductor structure has a particularly robust and durable design, whilst the switch strip conductor structure has a more delicate design in favor of considerable material savings and due to low mechanical stressing during connection and operation. This combined effect and the respective adaptation to the actual application purpose results in significant material savings and a considerable reliability. These are the main advantages of the invention.

Below, the invention is explained in detail with reference to a drawing showing only one embodiment, in which:

BRIEF DESCRIPTION OF THE DRAWINGS

FIG. 1 shows a perspective view of a component carrier of the invention for electrical/electronic components in form of a latch housing of a motor vehicle door latch and FIG. 2 shows details of the strip conductor structure of FIG. 1, also as a perspective view.

DETAILED DESCRIPTION OF THE DRAWINGS

The figures show a component carrier for electrical/electronic components 1, 2, 3. In the example, the component carrier is part of a latch housing 4 of a motor vehicle door latch, not shown, acting as a carrier element 4. Generally, the component carrier can, however also be provided as a separate entity arranged or positioned inside the latch housing 4. This is, however, not shown. This means that in the embodiment, the carrier element 4 and the latch housing 4 are synonymous or the component carrier represents a part of the latch housing 4 of the respective motor vehicle door latch, with the latch housing 4 as a whole or in parts acting as a carrier element 4 of the component carrier.

The electrical/electronic components 1, 2, 3 consist of an electric motor 1, only indicated, positioned in a respective motor seat or motor trough. FIG. 1 shows parts of the socket 2 provided for a connector, not shown, with the aid of which the electrical/electronic components 1, 2, 3 are electrically connected to a remote control unit 5, which is only indicated.

The electrical or electronic component 3 is a micro switch 3, shown in FIG. 1 as an example, which senses, for instance, individual functional positions of mechanical elements of the motor vehicle door latch. The electrical/electronic components 1, 2, 3 explained above and provided only as an example and which are not shown and described in full, are supported or accommodated on the latch housing 4, operating as a carrier element 4. A strip conductor structure 6, 7 shown in detail in FIG. 2 can be connected to the carrier element 4. The strip conductor structure 6, 7 comprises individual strip conductors 6' or 7'.

The connection between the latch housing or the carrier element 4 and the strip conductor structure 6, 7 can be provided in a conventional manner by the strip conductor structure 6, 7 being placed on or inserted in the latch housing 4 and then being preliminarily fixed by means of a casting compound or by using an adhesive. After this preliminary fixing, the electrical/electronic components 1, 2, 3 are connected to the strip conductor structure 6, 7 or the lugs 6" or 7" extending from the strip conductor structure 6, 7 (see FIG. 2). This can be achieved by simply pushing on or soldering, etc. of contacts.

In order to prevent lugs 6" or 7" from bending during installation or bending or even breaking during operation, the strip conductor structure 6, 7 consisting of individual metallic strip conductors 6, 7 contains, according to the invention, two strip conductor partial structures 6, 7 with different material thicknesses $s_1$, $s_2$ of the respective strip conductors 6, 7. Actually the material thickness $s_1$ of the first strip conductor structure 6 is typically more than 0.7 mm and in the example embodiment approx. 0.8 mm. In contrast, the material thickness $s_2$ of the second strip conductor structure 7 is typically below 0.5 mm and in the example embodiment approx. 0.4 mm.

In the example embodiment, the first strip conductor structure 6 is a motor strip conductor structure 6. In the example embodiment, the structure has been named motor strip conductor structure 6 as the at least one electric motor 1 is connected with the aid of this first strip conductor structure or motor strip conductor structure 6. As a result of the relatively great material thickness $s_1$ of the respective motor strip conductor structure 6 in the area of 0.7 mm and more, any folding, bending or breaking of the associated lugs 6" is prevented by the invention.

Also the thus achieved sturdiness of the motor strip conductor structure 6 takes into account the fact that the electric motor 1 moves during operation and generally rotates around its axis, thus pivoting, for instance, a driving worm. Such movements of the electric motor 1 are easily absorbed due to the significant material thickness $s_1$ of the respective motor strip conductor structure 6 without the respective lug 6" bending or tearing, etc.—also during operation.

To this contributes the fact that the motor strip conductor structure 6 according to the embodiment is produced from a heat-formable material, such as tinplate. As disclosed in DE10 2005 049 975 C5, a cold-rolled sheet steel with the specified material thickness $s_1$ of at least 0.7 mm can be used, which also contains a tin layer of at least 5 µm thickness in order to prevent any corrosion and to facilitate connection. A reliable function is also guaranteed over the entire service life of the described motor vehicle door latch.

In contrast, the second strip conductor partial structure 7 has a thinner material thickness $s_2$ of typically less than 0.5 mm an, in the embodiment of approx. 0.4 mm. Due to this thin material thickness $s_2$ the second conductor is a switch strip conductor structure 7, regularly produced from a cold-forming material, such as, for instance, brass. The respective lugs 7" can therefore also, when required, be (slightly) bend by hand. As a result, the micro switch 3 can, in the example, can be easily connected and soldered, for instance, to the lug 7".

FIG. 2 shows that the two strip conductor partial structures 6, 7 can generally be joined to the carrier element 4 as a combined complete strip conductor structure 6, 7. The example embodiment contains, however, two separately produced strip conductor partial structures 6, 7 joinable to the carrier element 4. This means that the respective strip conductor partial structure 6, 7 is first joined to the carrier element 4 and is then preliminarily fixed. The electrical components 1, 2, 3 are then electrically connected by means of all strip conductor structures 6, 7 or individual strip conductor structures 6, 7. The entire component carrier is then covered by the casting component and is sealed tightly.

The invention claimed is:

1. Component carrier for electrical/electronic components, for example for a combination with a latch housing or as a component of a latch housing of a motor vehicle door latch, comprising a carrier element and a strip conductor structure of individual metallic strip conductors which can be connected to the carrier element, characterized in that the strip conductor structure is composed of at least two strip conductor partial structures each having a different material thicknesses of the respective strip conductors, wherein one strip conductor partial structure is designed as a switch strip conductor structure with a predetermined material thickness and that the other strip conductor structure is designed as a motor strip conductor structure with a greater material thickness of the respective strip conductors.

2. Component carrier according to claim 1, characterized in that the two strip conductor partial structures are made of different materials.

3. Component carrier according to claim 1, characterized in that the switch strip conductor structure is produced from a cold-forming metal, such as brass.

4. Component carrier according to claim 1, characterized in that the motor strip conductor structure is made from heat-formable material, such as tinplate.

5. Component carrier according to claim 1, characterized in that the material of the motor strip conductor structure is approximately twice as thick than the switch strip conductor structure.

6. Component carrier according to claim 1, characterized in that the material thickness of the motor strip conductor structure is at least 0.7 mm and, in particular, 0.8 mm or more.

7. Component carrier according to claim 1, characterized in that the material thickness of the switch strip conductor structure is less than 0.5 mm and, in particular, 0.4 mm and less.

8. Component carrier according to claim 1, characterized in that the two strip conductor structures are produced by stamping.

9. Component carrier according to claim 1, characterized in that the motor strip conductor structure has a hardness of 48 HR to 56 HR.

10. Component carrier according to claim 1, characterized in that the switch strip conductor structure has a hardness between 35 and 200 HB.

11. Component carrier according to claim 1, characterized in that the two strip conductor structures are joined as combined complete strip conductor structures with the component carrier or each separately with the component carrier.

12. Component carrier according to claim 2, characterized in that the switch strip conductor structure is produced from a cold-forming metal, such as brass.

13. Component carrier according to claim 12, characterized in that the motor strip conductor structure is made from heat-formable material, such as tinplate.

14. Component carrier according to claim 13, characterized in that the material of the motor strip conductor structure is approximately twice as thick than the switch strip conductor structure.

15. Component carrier according to claim 14, characterized in that the material thickness of the motor strip conductor structure is at least 0.7 mm and, in particular, 0.8 mm or more.

16. Component carrier according to claim 15, characterized in that the material thickness of the switch strip conductor structure is less than 0.5 mm and, in particular, 0.4 mm and less.

17. Component carrier according to claim 16, characterized in that the motor strip conductor structure has a hardness of 48 HR to 56 HR.

18. Component carrier according to claim 17, characterized in that the switch strip conductor structure has a hardness between 35 and 200 HB.

19. Component carrier according to claim 18, characterized in that the two strip conductor structures are joined as combined complete strip conductor structures with the component carrier or each separately with the component carrier.

20. Component carrier according to claim 1, wherein the predetermined material thickness of the switch strip conductor structure is uniform along the switch strip conductor structure and wherein the greater material thickness of the motor strip conductor structure is uniform along the motor strip conductor structure.

* * * * *

UNITED STATES PATENT AND TRADEMARK OFFICE
CERTIFICATE OF CORRECTION

PATENT NO. : 9,596,759 B2  
APPLICATION NO. : 14/655788  
DATED : March 14, 2017  
INVENTOR(S) : Asmus Koch et al.

Page 1 of 1

It is certified that error appears in the above-identified patent and that said Letters Patent is hereby corrected as shown below:

In the Specification

Column 1, Line 10, please replace "10 2012 105 073.0" with --20 2012 105 073.0--

Signed and Sealed this
Twenty-third Day of May, 2017

Michelle K. Lee
*Director of the United States Patent and Trademark Office*